(12) United States Patent
Maeda

(10) Patent No.: US 6,492,668 B2
(45) Date of Patent: Dec. 10, 2002

(54) SOLID IMAGING DEVICE AND PRODUCTION METHOD THEREOF

(75) Inventor: Atsushi Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/852,736

(22) Filed: May 11, 2001

(65) Prior Publication Data

US 2002/0079518 A1 Jun. 27, 2002

(30) Foreign Application Priority Data

Dec. 22, 2000 (JP) .......................................... 2000-390315

(51) Int. Cl.[7] ............................................ H01L 27/148
(52) U.S. Cl. ......................... 257/226; 257/232; 257/233
(58) Field of Search ................................. 257/226, 232, 257/233, 344, 382, 225; 437/53

(56) References Cited

U.S. PATENT DOCUMENTS 5,246,875 A * 9/1993 Shinji et al. .................. 437/53
5,635,738 A * 6/1997 Shoda et al. ................. 257/225
5,925,914 A * 7/1999 Jiang et al. .................. 257/344
6,326,653 B1 * 12/2001 Nagata et al. ............... 257/232

OTHER PUBLICATIONS

US patent application publication US 2001/00191161 by HiguChi (Publication date Sep. 6, 2001.*

* cited by examiner

Primary Examiner—David Nelms
Assistant Examiner—Thinh Nguyen

(57) ABSTRACT

A solid imaging device includes a semiconductor substrate, a photodiode including a first diffusion layer formed on the substrate; and a MOS transistor including a second diffusion layer (FD region) and a third diffusion layer formed on the principal surface as source/drain regions. The FD region serves to perform a function of converting a signal charge, which is determined by the photodiode, into a signal voltage. An N+ diffusion layer having an impurity implanted at a high concentration is formed in the third diffusion layer in addition to an N– diffusion layer having an impurity implanted at a low concentration, whereas only an N– diffusion layer is formed in the FD region. An upper side of the FD region is covered with an oxide film serving as an implantation shielding layer for shielding against ion implantation.

7 Claims, 8 Drawing Sheets

SOLID IMAGING DEVICE AND PRODUCTION METHOD THEREOF

BACKGROUND OF THE INVENTION

1. Field of the Invention

The present invention relates to a semiconductor device having a solid imaging element, i.e. to a solid imaging device, and further to a method of producing the same.

2. Description of the Background Art

FIG. 13 is a view illustrating a circuit construction of a solid imaging device. Unit pixels or unit cells C are arranged in a matrix form, and each unit cell C is connected to a vertical shift register and a horizontal shift register.

Each unit cell C has a photodiode PD, a transfer switch M1, a reset switch M2, an amplifier M3, and a selection switch M4. The transfer switch M1, the reset switch M2, the amplifier M3, and the selection switch M4 are each formed of a MOS transistor. The photodiode PD serves to perform a function of converting incident light into an electric signal. The signal charge Q obtained by the photodiode PD is transferred by the transfer switch M1 to a diffusion layer FD (Floating Diffusion) for signal charge conversion. Assuming the capacitance of the FD to be C, the signal charge is converted into a voltage defined by V=Q/C. FIG. 14 illustrates a pattern layout of each element. FIG. 15 illustrates a cross-sectional view taken along the line XV—XV of FIG. 14.

Referring to FIG. 15, an isolation oxide film 2 is formed in a principal surface of a semiconductor substrate 1 by the LOCOS (local oxidation of silicon) method. A predetermined impurity is implanted into each of the active regions of the semiconductor substrate 1 surrounded and exposed by the isolation oxide film 2. The active regions include at least a region serving as the PD (hereafter referred to as a "PD region") and a region serving as the FD (hereafter referred to as a "FD region"). The PD region and the FD region are in an adjacent positional relationship to sandwich a gate electrode 8 formed above the principal surface of the semiconductor substrate 1. The side wall of the gate electrode 8 is covered with a side wall spacer.

The inside of the semiconductor substrate 1 contains a stress damage layer 31 generated by action of a mechanical load at the time of forming the isolation oxide film 2, an etching damage layer 32 generated by etching for forming the side wall spacer, and an ion implantation damage layer 33 generated by ion implantation into the active regions. When a part ΔQ of the electric charge Q is lost as a leakage current through the defects of these damage layers, the sensitivity of the solid imaging device decreases to deteriorate the pixel characteristics.

Therefore, an object of the present invention is to provide a solid imaging device in which the damage layers are reduced as much as possible.

SUMMARY OF THE INVENTION

In order to achieve the aforesaid object, a solid imaging device according to one aspect of the present invention includes a semiconductor substrate having a principal surface, a photodiode including a first diffusion layer formed on the principal surface, and a MOS (Metal Oxide Semiconductor) transistor including a second diffusion layer and a third diffusion layer formed on the principal surface as source/drain regions. The second diffusion layer serves to perform a function of converting a signal charge, which is determined by the photodiode, into a signal voltage. The second diffusion layer has an impurity concentration less than or equal to $\frac{1}{10}$ of an impurity concentration of the third diffusion layer By adopting the aforesaid construction, a high concentration diffusion layer is not formed in the FD region serving as the second diffusion layer, thereby restraining the formation of the ion implantation damage layer in the semiconductor substrate at the FD region. Therefore, the leakage current caused by the defects of the damage layers can be reduced. Also, since the concentration of the diffusion layer itself decreases, the electric field at the PN junction interface is alleviated to reduce the leakage current.

In the aforesaid invention, an upper side of the second diffusion layer is preferably covered with an implantation shielding layer for shielding against ion implantation. By adopting this construction, a side wall spacer is not formed on the FD region serving as the second diffusion layer, and a high concentration diffusion layer is not formed in the FD region, either. Therefore, the etching damage layer generated at the time of forming the side wall spacer and the ion implantation damage layer generated at the time of forming the high concentration diffusion layer are not generated in the FD region. Thus, the generation of damage layers can be restrained, thereby reducing the leakage current.

In the aforesaid invention, it is preferable that the MOS transistor includes a side wall spacer formed by etching, an etching protective layer intervenes between the second diffusion layer and the side wall spacer and between the third diffusion layer and the side wall spacer for preventing generation of damages to the principal surface by the etching, and an upper side of the second diffusion layer and an upper side of the third diffusion layer are covered with the etching protective layer. By adopting this construction, generation of an etching damage layer in the FD region serving as the second diffusion layer can be avoided. Since the etching damage layer as well as the ion implantation damage layer generated at the time of forming the high concentration diffusion layer can be reduced, the total amount of damage layers can be reduced, thereby leading to decrease in the leakage current.

In order to achieve the aforesaid object of the present invention, a solid imaging device according to another aspect of the present invention includes a semiconductor substrate having a principal surface, a photodiode including a first diffusion layer formed on the principal surface, and a MOS transistor including a second diffusion layer and a third diffusion layer formed on the principal surface as source/drain regions. The MOS transistor includes a side wall spacer formed by etching. An etching protective layer intervenes between the second diffusion layer and the side wall spacer and between the third diffusion layer and the side wall spacer for preventing generation of damages to the principal surface by the etching. An upper side of the second diffusion layer and an upper side of the third diffusion layer are covered with the etching protective layer. By adopting this construction, generation of an etching damage layer in the FD region serving as the second diffusion layer can be avoided. As a result of this, the total amount of damage layers can be reduced, thereby leading to decrease in the leakage current.

In order to achieve the aforesaid object, a solid imaging device according to still another aspect of the present invention includes a semiconductor substrate having a principal surface, a photodiode including a first diffusion layer formed on the principal surface, and a MOS transistor including a second diffusion layer and a third diffusion layer formed on the principal surface as source/drain regions. The second diffusion layer serves to perform a function of converting a signal charge, which is determined by the photodiode, into a signal voltage. The MOS transistor includes an isolation oxide film formed on the principal surface, a gate electrode formed on an upper side of the isolation oxide film, and a side wall spacer that covers a side part of the gate electrode. The second diffusion layer includes a first part in which a first impurity implantation has been carried out and a second part in which a second impurity implantation has been carried out. The second part extends in a range that includes and goes beyond the first part, as viewed from above.

By adopting this construction, the additional implantation diffusion layer serving as the second part is diffused to go beyond the range of the low concentration diffusion layer and the high concentration diffusion layer serving as the first part, as viewed from above. Therefore, the defects of the stress damage layer located near the isolation oxide film are covered with the additional implantation diffusion layer, so that no defects that may cause leakage in the electric current are present in a range to which the depletion layer of the PN junction between the semiconductor substrate and the high concentration diffusion layer extends. Therefore, the leakage current can be reduced.

In the aforesaid invention, the gate electrode and the side wall spacer are preferably formed to be limited within an area of the isolation oxide film, as viewed from above. By adopting this construction, there will be no part shadowed by the side wall spacer before the isolation oxide film, so that the additional implantation diffusion layer serving as the second part can easily reach the stress damage layer generated in the neighborhood of the isolation oxide film. Therefore, the additional implantation diffusion layer can cover the stress damage layer to a larger depth, and the defects of the stress damage layer can be made harmless with more certainty. As a result, the leakage current can be reduced, whereby the sensitivity as a solid imaging device is improved to provide better pixel characteristics.

In order to achieve the aforesaid object, a method of producing a solid imaging device according to one aspect of the present invention includes performing an isolation oxide film forming step of forming an isolation oxide film in a principal surface of a semiconductor substrate, performing a gate electrode forming step of forming a gate electrode at a position selected from an upper surface of the isolation oxide film, performing a first implantation step of implanting an impurity at a first concentration into a first region and a second region which are in the principal surface and defined by the isolation oxide film and which are in an opposite positional relationship with respect to each other to sandwich the gate electrode, thereafter performing a covering step of covering an entire surface of the semiconductor substrate with an oxide film, performing a side wall spacer forming step of partially removing the oxide film so as to expose the principal surface of the first region while leaving a part of the oxide film that covers the second region, and to form a side wall spacer that covers a side part of the gate electrode, and performing a second implantation step of implanting an impurity at a second concentration into the principal surface of the first region.

By adopting the aforesaid method, the impurity implantation at the second concentration is carried out in a state in which the second region is covered with the oxide film, so that the diffusion layer having a high concentration serving as the second concentration is not formed in the FD region serving as the second region. Therefore, the generation of damage layers accompanying the ion implantation can be restrained to reduce the leakage current.

In order to achieve the aforesaid object, a method of producing a solid imaging device according to another aspect of the present invention includes performing an isolation oxide film forming step of forming an isolation oxide film in a principal surface of a semiconductor substrate, performing a gate electrode forming step of forming a gate electrode at a position selected from an upper surface of the isolation oxide film, performing a first implantation step of implanting an impurity at a first concentration into a first region and a second region which are in the principal surface and defined by the isolation oxide film and which are in an opposite positional relationship with respect to each other to sandwich the gate electrode, thereafter performing an oxide film covering step of covering an entire surface of the semiconductor substrate with an oxide film, thereafter performing a nitride film covering step of forming a nitride film to cover the entire surface of the semiconductor substrate, performing a side wall spacer forming step of partially removing the nitride film so as to form a side wall spacer that covers a side part of the gate electrode from the nitride film and to leave the oxide film, and performing a second implantation step of implanting an impurity at a second concentration into the principal surface of the first region.

By adopting the aforesaid method, the etching for forming the side wall spacer is carried out so that the oxide film serving as the etching protective layer remains under the side wall spacer, so that the effects of the etching are prevented from reaching the semiconductor substrate side by the oxide film. Therefore, the generation of the etching damage layer in the FD region serving as the second region can be avoided. This can reduce the damage layers, leading to decrease in the leakage current.

In the aforesaid invention, the second implantation step preferably includes masking the second region to prevent the second concentration impurity from being implanted into the principal surface of the second region. By adopting this method, the diffusion layer having a high concentration serving as the second concentration is not formed in the FD region serving as the second region. Therefore, the generation of ion implantation damages in the FD region can be prevented as well. This leads to more reduction in the leakage current, so that it is preferable.

In order to achieve the aforesaid object, a method of producing a solid imaging device according to still another aspect of the present invention includes performing an isolation oxide film forming step of forming an isolation oxide film in a principal surface of a semiconductor substrate, performing a gate electrode forming step of forming a gate electrode at a position selected from an upper surface of the isolation oxide film, performing a side wall spacer forming step of forming a side wall spacer to cover a side part of the gate electrode, performing a first implantation step of implanting a first impurity under a first condition into an active region which is in the principal surface and defined by the isolation oxide film and which is adjacent to the gate electrode, and performing a second implantation step of implanting a second impurity into the active region under a second condition such that the second impurity is diffused in a range that includes and goes beyond a part to which the first impurity implanted in the first implantation step is diffused, as viewed from above.

By adopting the aforesaid method, the additional implantation diffusion layer implanted in the second implantation step is diffused to go beyond the range of the low concentration diffusion layer and the high concentration diffusion layer serving as the first part, as viewed from above. Therefore, the defects of the stress damage layer located near the isolation oxide film are covered with the additional implantation diffusion layer, so that no defects that may cause leakage in the electric current are present in a range to which the depletion layer of the PN junction between the semiconductor substrate and the high concentration diffusion layer extends. Therefore, the leakage current can be reduced.

In the aforesaid invention, the gate electrode and the side wall spacer are preferably formed to be limited within an area of the isolation oxide film, as viewed from above, in the gate electrode forming step and in the side wall spacer forming step. By adopting this method, there will be no part shadowed by the side wall spacer before the isolation oxide film, so that the additional implantation diffusion layer serving as the second part can easily reach the stress damage layer generated in the neighborhood of the isolation oxide film. Therefore, the additional implantation diffusion layer can cover the stress damage layer to a larger depth, and the leakage current can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
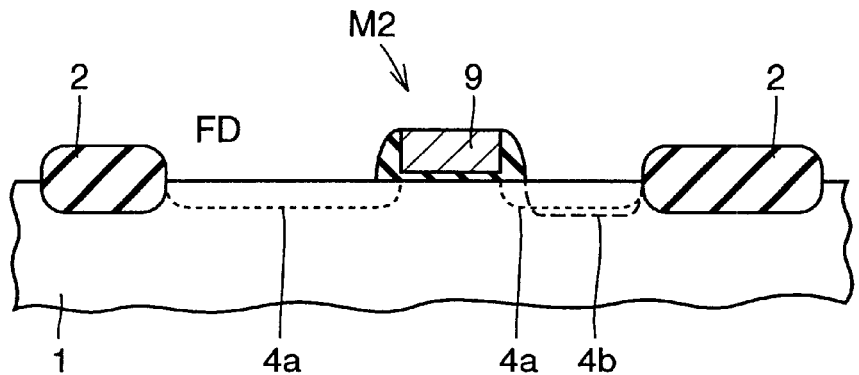
FIG. 1 is a cross-sectional view of a solid imaging device according to a first embodiment of the present invention.
Figure 14:
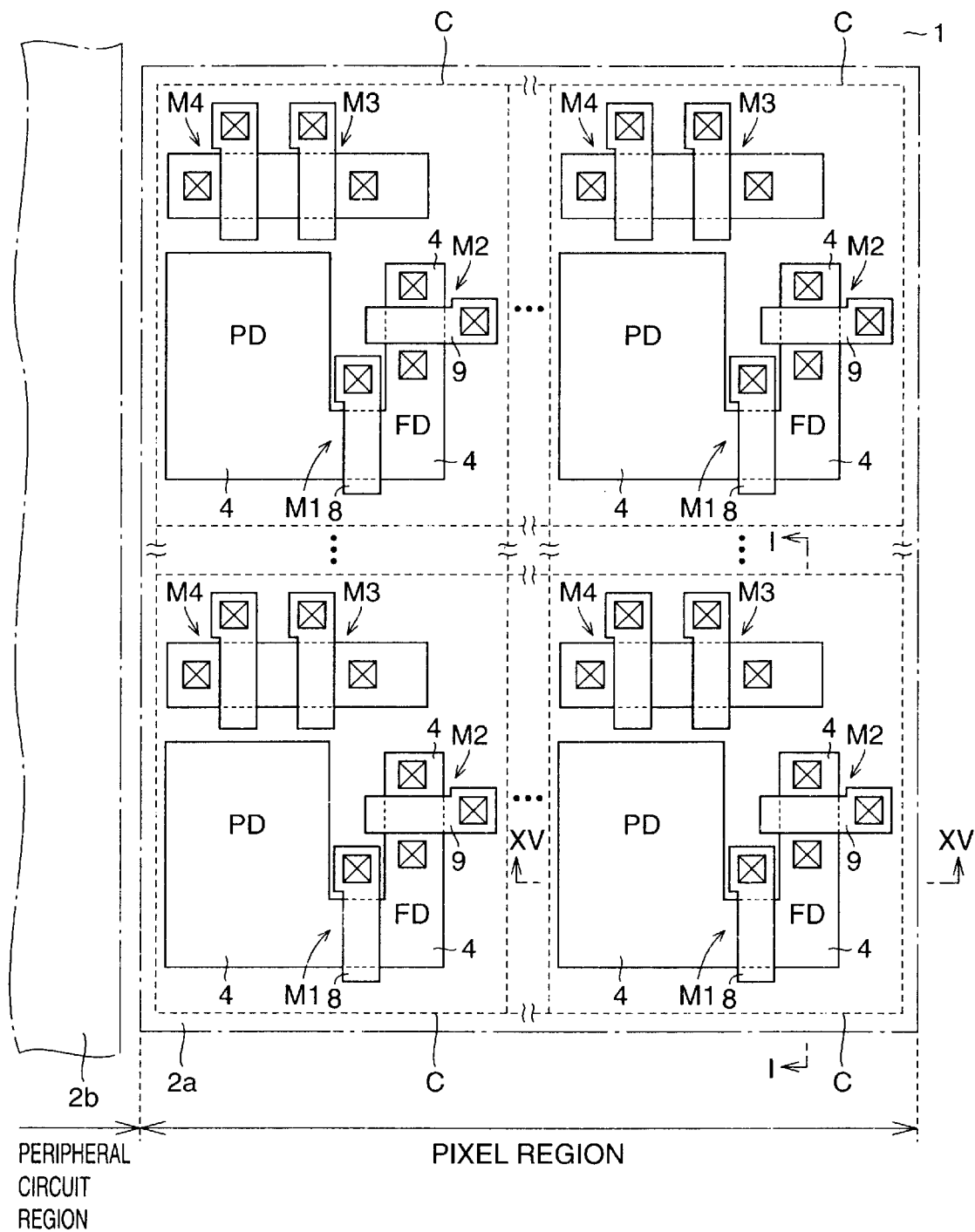
FIG. 14 is a pattern layout diagram of a solid imaging device according to a prior art.

Referring to FIG. 1, the construction of a solid imaging device according to the first embodiment of the present invention will be described. FIG. 1 is a cross-sectional view in a state in which the present invention is applied to a part corresponding to the cross-sectional view taken along the line I—I of FIG. 14. An isolation oxide film 2 by the LOCOS method and a gate electrode 9 of a MOS transistor serving as a switch M2 are formed on the principal surface of a P-type semiconductor substrate 1. An FD region is disposed at a position adjacent to the switch M2. Although not viewable in FIG. 1, a PD region is located at a position adjacent to the FD region to sandwich a switch M1. Since impurities are respectively implanted in the PD region and the FD region, the PD region will be also referred to as a first diffusion layer, and the FD region will be also referred to as a second diffusion layer. On the other hand, a diffusion layer located at a position opposite to the FD region to sandwich the switch M2 in FIG. 1 (i.e. on the right side of the switch M2 in FIG. 1) is not the FD region, and will be herein referred to as a third diffusion layer. The signal charge generated by incident light in the PD region serving as the first diffusion layer is transferred to the second diffusion layer by the switch M1, and is converted to a voltage by the FD region serving as the second diffusion layer to be further transmitted to the third diffusion layer by the switch M2. The FD region serves to perform a function of converting the signal charge determined by the photodiode into a signal voltage, and also serves to perform the function of the source/drain regions of the MOS transistors serving as the switch M1, M2.

Referring to FIG. 1, the FD region includes an N-type diffusion layer. This N-type diffusion layer includes only a diffusion layer 4a made, for example, of P (phosphorus) of about $10^{17}$ to $10^{18}/cm^3$ (hereafter, the diffusion layer of this concentration and implantation seed is referred to as an "N− diffusion layer"). The N− diffusion layer 4a may also be referred to as a "low concentration diffusion layer". The third diffusion layer includes a diffusion layer 4b made, for example, of As (arsenic) of about $10^{20}$ to $10^{21}/cm^3$ (hereafter, the diffusion layer of this concentration and implantation seed is referred to as an "N+ diffusion layer") in addition to the N− diffusion layer 4a. The N+ diffusion layer 4b may also be referred to as a "high concentration diffusion layer".

This structure can be realized, for example, by selective implantation into the third diffusion layer serving as the non-FD region by forming a photoresist pattern or the like to cover the FD region prior to the ion implantation for forming the N+ diffusion layer 4b.

In the solid imaging device according to this embodiment, the N+ diffusion layer 4b is not formed in the FD region, thereby restraining the formation of the ion implantation damage layer 33 in the semiconductor substrate 1 at the FD region. As a result, the leakage current caused by the defects of the damage layers can be reduced. Also, since the concentration of the diffusion layer itself decreases, the electric field at the PN junction interface is alleviated to reduce the leakage current.

Here, in the aforesaid example, the impurity concentration of the N− diffusion layer 4a is set to be about $10^{17}$ to $10^{18}/cm^3$, and the impurity concentration of the N+ diffusion layer 4b is set to be about $10^{20}$ to $10^{21}/cm^3$; however, the combination of concentrations is not limited to this alone. The idea of the present invention can be applied as long as the impurity concentration of the N− diffusion layer 4a is less than or equal to $\frac{1}{10}$ of the impurity concentration of the N+ diffusion layer 4b. Nevertheless, practically speaking, it is preferable to adopt a combination of concentrations such that the impurity concentration of the N− diffusion layer 4a is more than or equal to $\frac{1}{10}^6$ and less than or equal to $\frac{1}{10}$ of the impurity concentration of the N+ diffusion layer 4b. Further, when one takes the problem of parasitic capacitance and the problem of hot carriers into account, a combination of more than or equal to $\frac{1}{10}^4$ and less than or equal to $\frac{1}{10}^2$ is preferable in the aforesaid numerical range.

Second Embodiment

Figure 2:
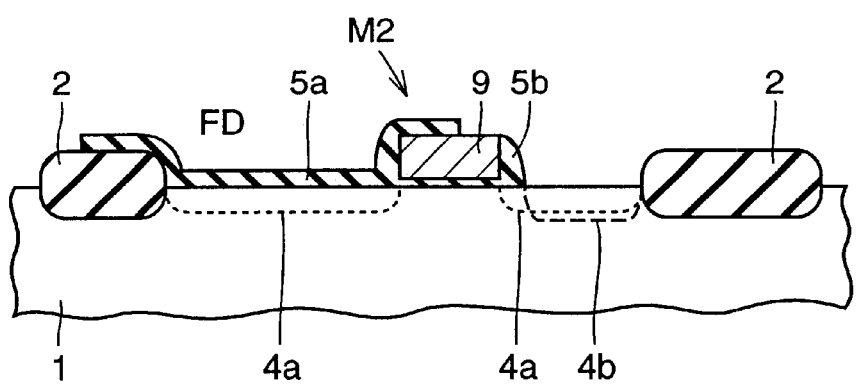
FIG. 2 is a cross-sectional view of a solid imaging device according to a second embodiment of the present invention.

Referring to FIG. 2, the construction of a solid imaging device according to the second embodiment of the present invention will be described. FIG. 1 is a cross-sectional view cut in the same manner as in FIG. 1. Basically, the solid imaging device of this embodiment is similar to the solid imaging device of the first embodiment. Only an N− diffusion layer 4a is formed as a diffusion layer in the FD region, whereas an N− diffusion layer 4a and an N+ diffusion layer 4b are formed in the third diffusion layer. An oxide film 5a formed by the CVD (Chemical Vapor Deposition) method covers the upper side of the FD region as an implantation shielding layer for shielding against ion implantation.

Figure 3:
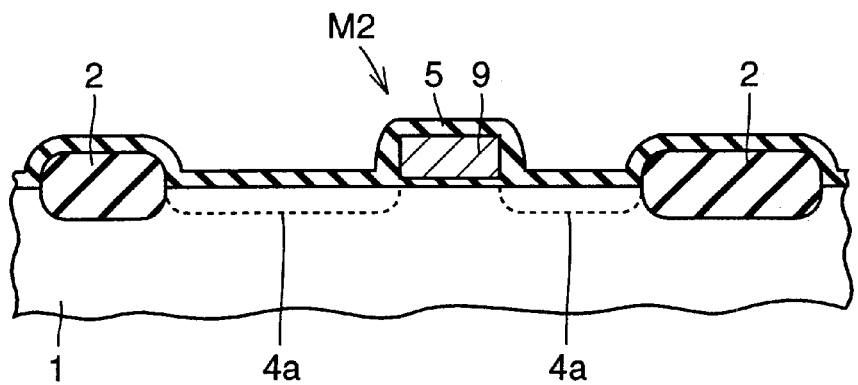
FIG. 3 is a first explanatory view for describing a method of producing the solid imaging device according to the second embodiment of the present invention.
Figure 4:
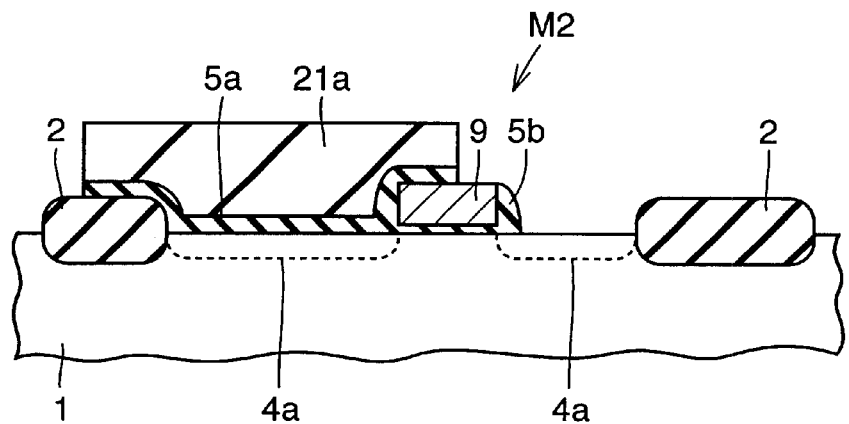
FIG. 4 is a second explanatory view for describing a method of producing the solid imaging device according to the second embodiment of the present invention.
Figure 5:
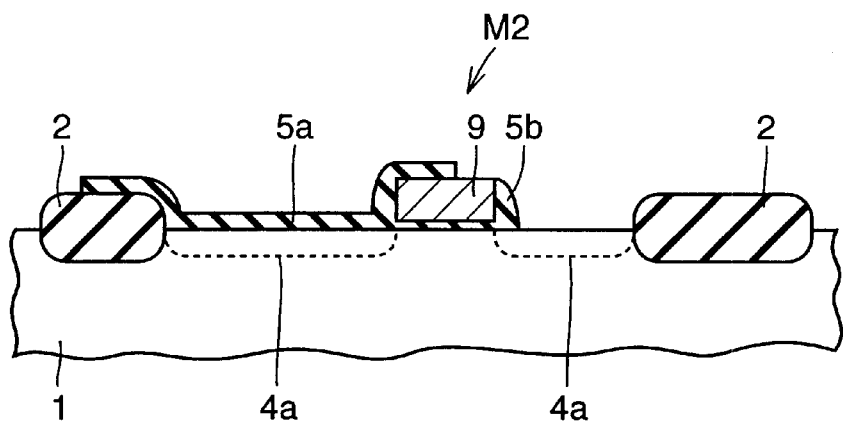
FIG. 5 is a third explanatory view for describing a method of producing the solid imaging device according to the second embodiment of the present invention.

Referring to FIGS. 3 to 5, a method of producing a solid imaging device according to this embodiment will be described. Referring to FIG. 3, after an N− diffusion layer 4a is formed in an active region of a semiconductor substrate 1, an oxide film 5 is formed by the CVD method over the entire surface of the semiconductor substrate 1. Referring to FIG. 4, after a photoresist 21a is formed to cover the upper part of the FD region, the exposed part of the oxide film 5 is removed by etching. Referring to FIG. 5, the photoresist 21a is removed. Ion implantation is carried out with As or the like at about $10^{20}$ to $10^{21}/cm^3$ to form an N+ diffusion layer 4b such as illustrated in FIG. 2. Since the FD region is covered with the photoresist 21a, the N+ diffusion layer 4b is formed in a part other than the FD region.

Since the solid imaging element according to this embodiment has a construction such that the oxide film 5 serving as the implantation shielding layer is left to cover the upper part of the FD region, the side wall spacer is not formed on the FD region, and the N+ diffusion layer 4b is not formed in the FD region, either. Therefore, the etching damage layer 32 generated at the time of forming the side wall spacer and the ion implantation damage layer 33 generated at the time of forming the N+ diffusion layer are not generated in the FD region. Thus, the generation of damage layers can be restrained, thereby reducing the leakage current. As a result, the sensitivity as a solid imaging device is improved to provide better pixel characteristics.

Third Embodiment

Figure 6:
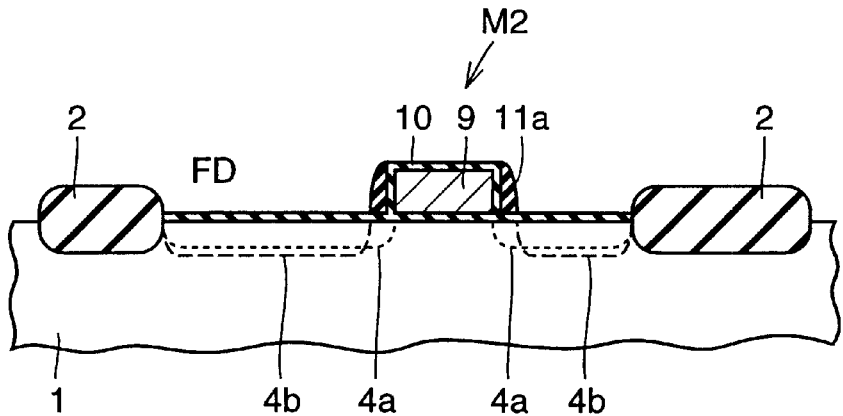
FIG. 6 is a cross-sectional view of one example of a solid imaging device according to a third embodiment of the present invention.

Referring to FIG. 6, the construction of a solid imaging device according to the third embodiment of the present invention will be described. FIG. 6 is a cross-sectional view cut in the same manner as in FIG. 1. An FD region and a third diffusion layer are disposed to sandwich a switch M2, and a side wall spacer 11a made of nitride film covers the side wall of the gate electrode 9 of the switch M2. An oxide film 10 is present on the upper surface of the FD region and the third diffusion layer as an etching protective layer for preventing generation of damages to the principal surface by etching, and the oxide film 10 also intervenes between the side wall spacer 11a and the semiconductor substrate 1.

Figure 7:
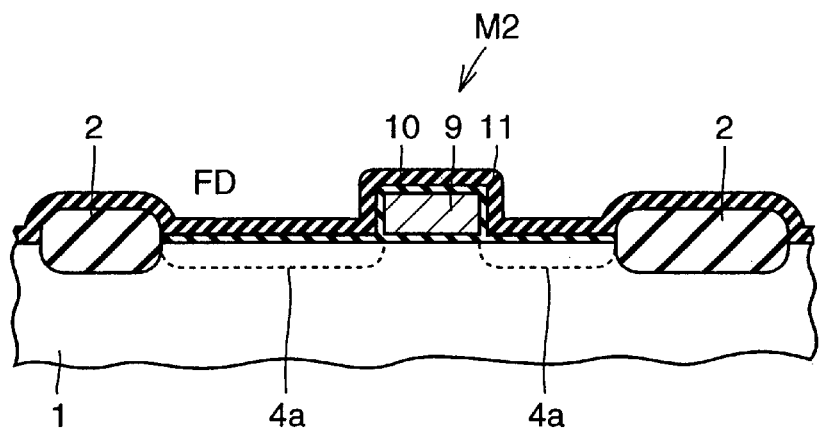
FIG. 7 is a first explanatory view for describing a method of producing the solid imaging device according to the third embodiment of the present invention.
Figure 8:
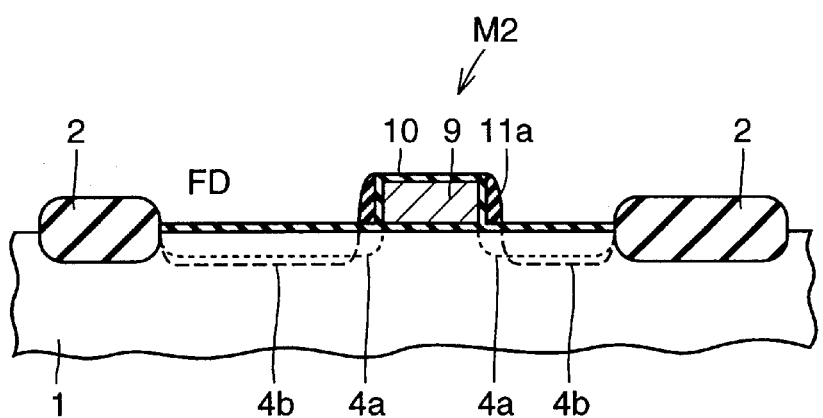
FIG. 8 is a second explanatory view for describing a method of producing the solid imaging device according to the third embodiment of the present invention.

Referring to FIGS. 7 and 8, a method of producing a solid imaging device according to this embodiment will be described. After an N− diffusion layer 4a is formed in an active region of a semiconductor substrate 1, an oxide film 10 is formed by the CVD method over the entire surface of the semiconductor substrate 1. However, the oxide film 10 is formed to have a small thickness. For example, the oxide film 10 is formed to have a thickness of about 500 Å. Subsequently, a film made of a material different from the oxide film 10, for example, a nitride film 11 is laminated to a thickness of 1500 to 2000 Å. Thus, a structure shown in FIG. 7 is obtained.

Subsequently, the nitride film 11 is etched to form a side wall spacer 11a. This etching is carried out under a condition to leave the oxide film 10. Next, ion implantation is carried out into the FD region and the region of the third diffusion layer through the oxide film 10 to form an N+ diffusion layer 4b. Thus, a structure shown in FIG. 8 is obtained.

In the solid imaging element of this embodiment, the etching for forming the side wall spacer 11a is carried out so that the oxide film 10 serving as the etching protective layer remains under the side wall spacer 11a, so that the effects of the etching are prevented from reaching the semiconductor substrate 1 side by the oxide film 10. Therefore, the generation of the etching damage layer 32 in the FD region can be avoided. This can reduce the damage layer, leading to decrease in the leakage current. As a result, the sensitivity as a solid imaging device is improved to provide better pixel characteristics.

Figure 9:
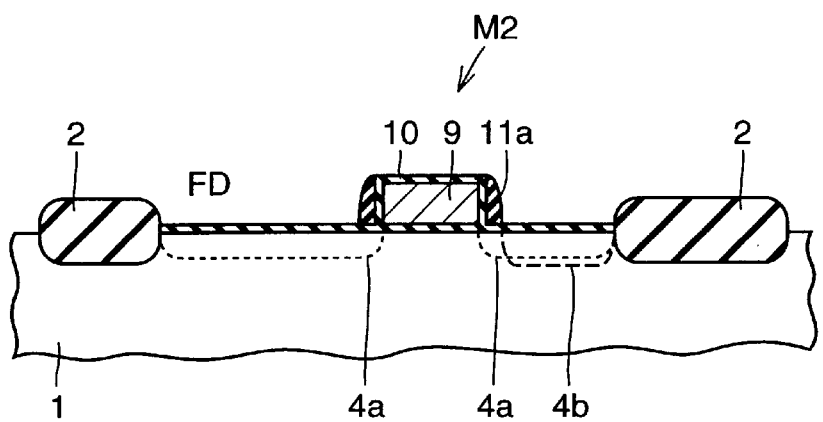
FIG. 9 is a cross-sectional view of another example of a solid imaging device according to the third embodiment of the present invention.

Also, if the N+ diffusion layer 4b is not formed in the FD region as illustrated in FIG. 9, the generation of the ion implantation damage layer 33 can be prevented as well, so that it is more preferable. In order to realize this, a photoresist 21a may be formed to cover the upper side of the FD region and ion implantation for forming the N+ diffusion layer 4b may be selectively carried out, as shown in the second embodiment.

Fourth Embodiment

Figure 10:
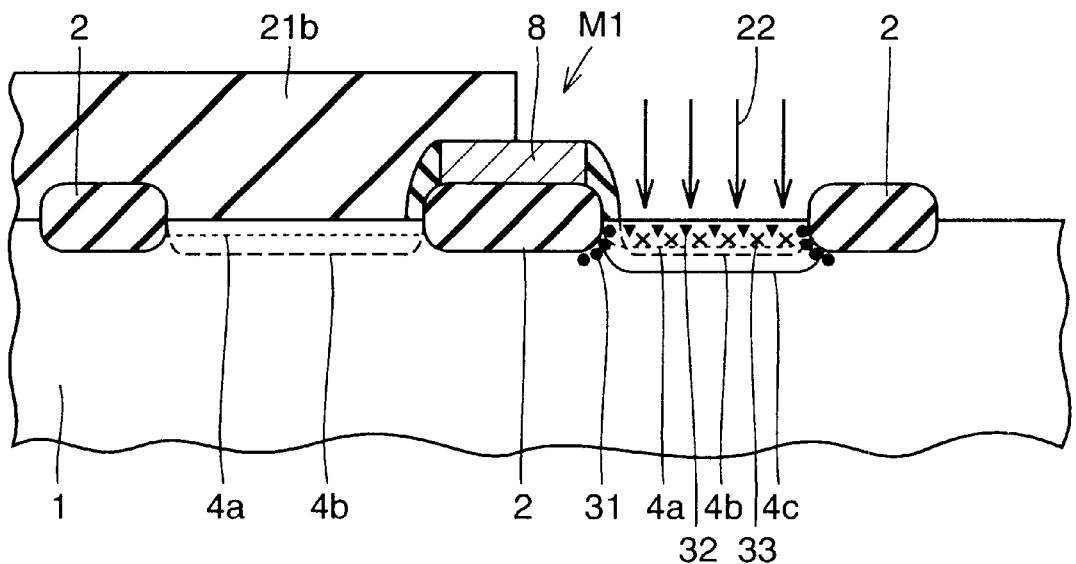
FIG. 10 is a cross-sectional view of a solid imaging device according to a fourth embodiment of the present invention.
Figure 15:
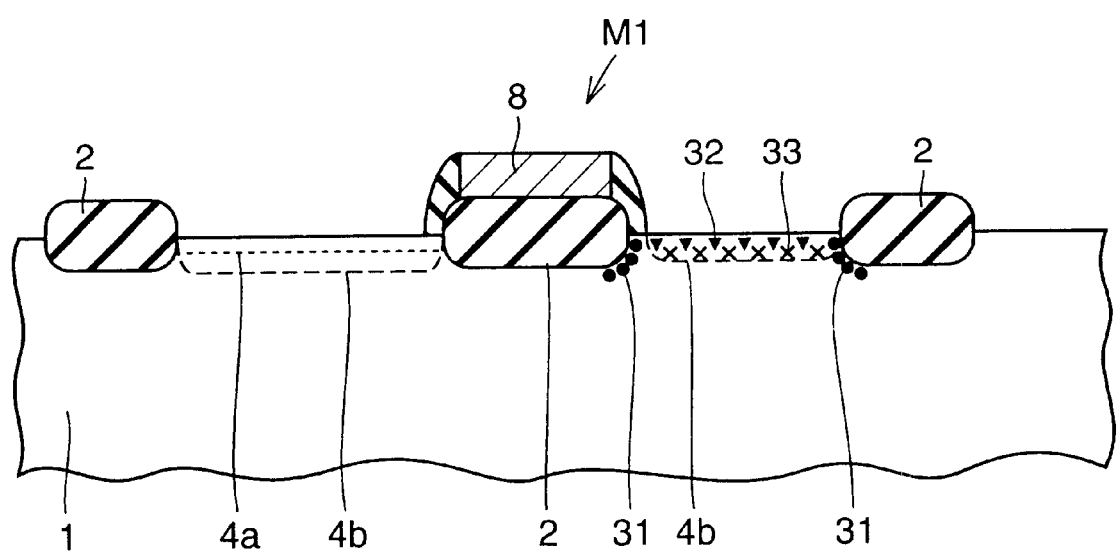
FIG. 15 is a cross-sectional view of a solid imaging device according to a prior art, taken along the line XV—XV of FIG. 14.

Referring to FIG. 10, the construction of a solid imaging device according to the fourth embodiment of the present invention will be described. FIG. 10 is a cross-sectional view cut in the same manner as in FIG. 15. Therefore, a PD region is disposed on the left side and an FD region is disposed on the right side to sandwich the MOS transistor serving as the switch M1. In the FD region, after an N− diffusion layer 4a, a side wall spacer 5b, and an N+ diffusion layer 4b are formed, an N-type impurity such as P (phosphorus) is implanted at a concentration of about $10^{18}$ to $10^{19}/cm^3$ which is a middle concentration between the concentration of the N− diffusion layer 4a and the N+ diffusion layer 4b. The implantation carried out under such a condition after implantation of other impurities will be referred to as "additional implantation", and a diffusion layer formed by this additional implantation will be referred to as an "additional implantation diffusion layer". The surface of the PD region which is not to be subjected to additional implantation is covered with a photoresist 21b. In the final mode, the photoresist 21b may be absent.

Referring to FIG. 10, a method of producing a solid imaging device according to this embodiment will be described. After an N− diffusion layer 4a is formed in an active region that is to become an FD region, a side wall spacer 5b of a switch M1 is formed. Next, an N+ diffusion layer 4b is formed. The process up to this step is the same as in the method of producing a conventional solid imaging device. In the solid imaging device of this embodiment, a photoresist 21b is further formed thereafter, and additional implantation is carried out selectively in the FD region, as shown by arrows 22. Namely, an N-type impurity such as P (phosphorus) which is easily diffused by a thermal treatment is implanted at about $10^{18}$ to $10^{19}/cm^3$. In the end, the additionally implanted impurity is diffused at least towards the lateral side to extend beyond the range of the N− diffusion layer 4a, because the additionally implanted impurity has a higher concentration than the concentration of the impurity implanted as the N− diffusion layer 4a in terms of concentration. Further, since an impurity of the type that is easily diffused by a subsequent thermal treatment, such as P, is selected, the additionally implanted impurity is diffused at least towards the lateral side to extend beyond the range of the N+ diffusion layer 4b as well. Namely, the additional implantation diffusion layer 4c is distributed in a range that includes and extends beyond the N− diffusion layer 4a and the N+ diffusion layer 4b, as viewed from above. After the additional implantation, the photoresist 21b is removed.

Since the additional implantation diffusion layer 4c is diffused beyond the range of the N− diffusion layer 4a and the N+ diffusion layer 4b as viewed from above, the defects of the stress damage layer 31 located near the isolation oxide film 2 are covered with the additional implantation diffusion layer 4c, so that no defects that may cause leakage in the electric current are present in a range to which the depletion layer of the PN junction between the semiconductor substrate 1 and the N+ diffusion layer 4b extends. Therefore, the leakage current can be reduced, whereby the sensitivity as a solid imaging device is improved to provide better pixel characteristics.

Here, an ion implantation damage layer 33 is generated to some extent by the additional implantation; however, the decrease in the damage layers brought about by the additional implantation diffusion layer 4c covering the stress damage layer 31 surpasses the increase in the damage layers caused by the ion implantation damage layer 33, so that it is advantageous to carry out the additional implantation as in this embodiment.

In this example, the additional implantation is carried out after the N+ diffusion layer 4b is formed; however, the additional implantation may be carried out before or simultaneously with the formation of the N+ diffusion layer 4b.

Even in the case of the first embodiment where the N+ diffusion layer 4b is not formed in the FD region, it is advantageous to apply the idea of this embodiment to carry out the additional implantation into the FD region where only the N− diffusion layer 4a is formed, because the stress damage layer 31 can be made harmless.

Fifth Embodiment

Figure 11:
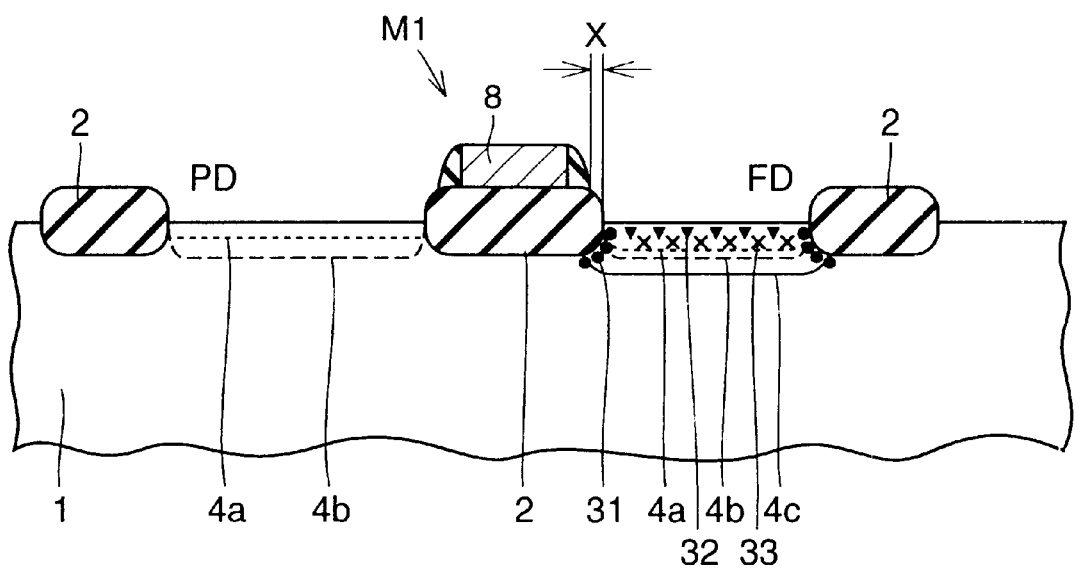
FIG. 11 is a cross-sectional view of a solid imaging device according to a fifth embodiment of the present invention.

Referring to FIG. 11, the construction of a solid imaging device according to the fifth embodiment of the present invention will be described. FIG. 11 is a cross-sectional view cut in the same manner as in FIG. 10. The construction of the solid imaging device according to this embodiment is similar to that of the solid imaging device in the fourth embodiment; however, the structure of the switch M1 is different. In this embodiment, the gate electrode 8 and the side wall spacer 5b are formed to be limited within the area of the isolation oxide film 2, as viewed from above.

The method of forming the solid imaging device according to this embodiment is similar to that in the fourth embodiment except that the gate electrode 8 and the side wall spacer 5b are formed to be limited within the area of the isolation oxide film 2, as viewed from above, at the time of forming these.

Figure 12:
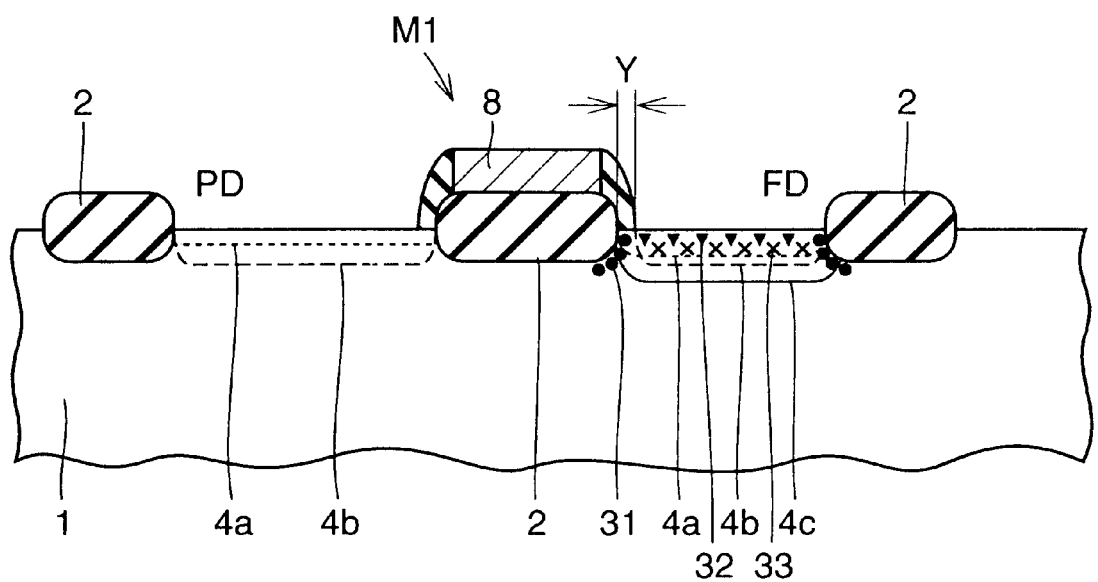
FIG. 12 is a cross-sectional view of a solid imaging device cited as a comparative example in the fifth embodiment of the present invention.
Figure 13:
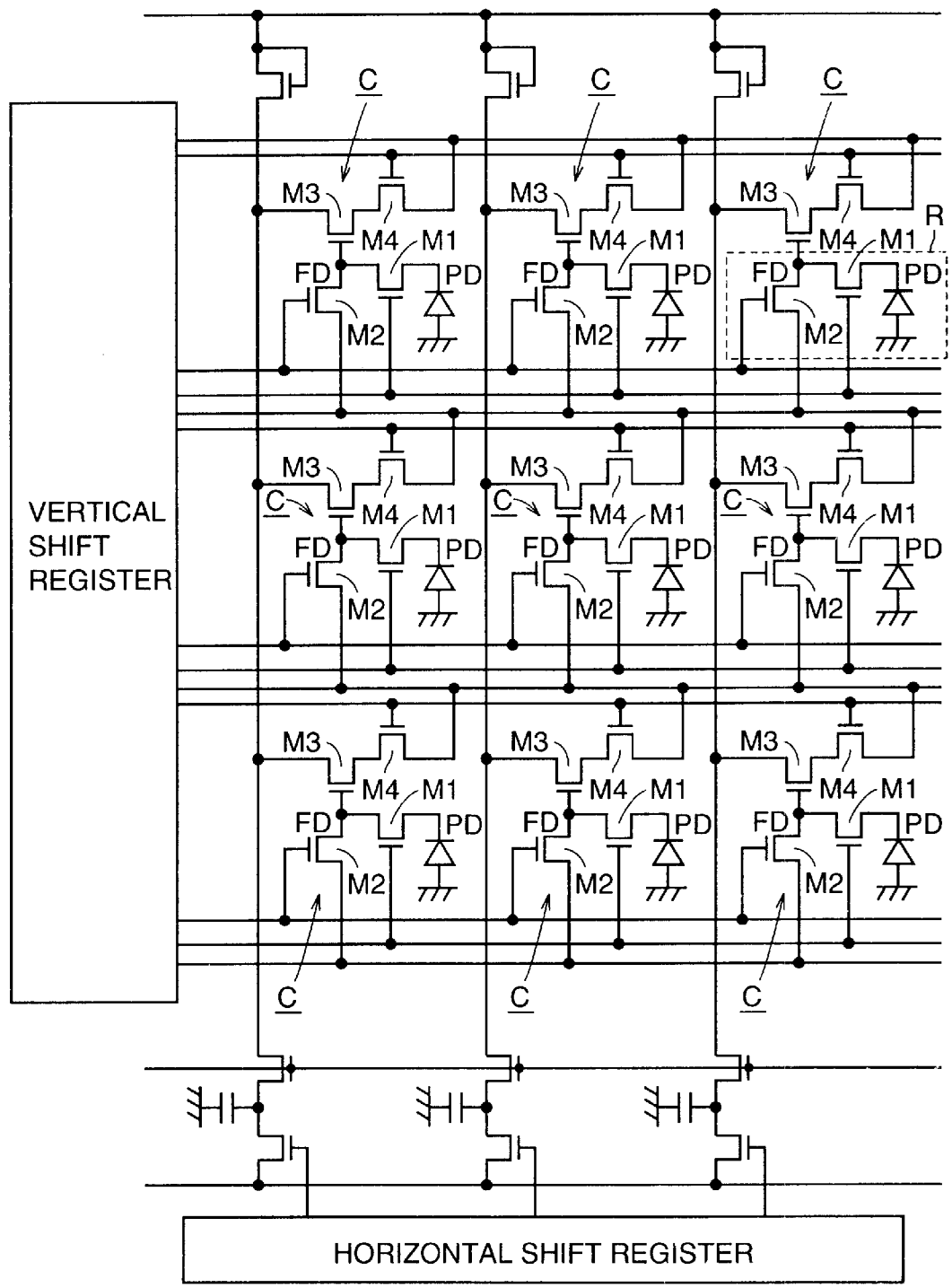
FIG. 13 is a circuit construction view of a solid imaging device according to a prior art.

If the outside end of the side wall spacer 5b protrudes by Y from the end of the isolation oxide film 2, as illustrated in FIG. 12, the stress damage layer 31 generated in the neighborhood of the isolation oxide film 2 is shadowed by the outer end of the side wall spacer 5b at the time of carrying out the additional implantation. Therefore, the depth that the additional implantation diffusion layer 4c can reach is limited, even though the additional implantation diffusion layer 4c is easily diffused towards the lateral side.

In contrast, in the solid imaging device according to this embodiment, since the outside end of the side wall spacer 5b is retreated by X from the end of the isolation oxide film 2 (here, $X \geq 0$) as illustrated in FIG. 11, there will be no part shadowed by the side wall spacer 5b before the isolation oxide film 2, so that the additional implantation diffusion layer 4c can easily reach the stress damage layer 31 generated in the neighborhood of the isolation oxide film 2. Therefore, the additional implantation diffusion layer 4c can cover the stress damage layer 31 to a larger depth, and the defects of the stress damage layer 31 can be made harmless with more certainty. As a result, the leakage current can be reduced, whereby the sensitivity as a solid imaging device is improved to provide better pixel characteristics.

According to the present invention, the high concentration diffusion layer is not formed in the FD region serving as the second diffusion layer, thereby restraining the formation of the ion implantation damage layer in the semiconductor substrate in the FD region. As a result, the leakage current caused by the defects of the damage layers can be reduced. Also, since the concentration of the diffusion layer itself decreases, the electric field at the PN junction interface is alleviated to reduce the leakage current. Therefore, the sensitivity as a solid imaging device is improved to provide better pixel characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid imaging device comprising:
    a semiconductor substrate having a principal surface;
    a photodiode including a first diffusion layer formed on said principal surface; and
    a MOS (Metal Oxide Semiconductor) transistor including a second diffusion layer and a third diffusion layer formed on said principal surface as source/drain regions,
    said second diffusion layer serving to perform a function of converting a signal charge, which is determined by said photodiode, into a signal voltage, and
    said second diffusion layer having an impurity concentration less than or equal to $\frac{1}{10}$ of an impurity concentration of said third diffusion layer.

2. The solid imaging device according to claim 1, wherein an upper side of said second diffusion layer is covered with an implantation shielding layer for shielding against ion implantation.

3. The solid imaging device according to claim 1, wherein said MOS transistor includes a side wall spacer formed by etching, an etching protective layer intervenes between said second diffusion layer and said side wall spacer and between said third diffusion layer and said side wall spacer for preventing generation of damages to said principal surface by said etching, and an upper side of said second diffusion layer and an upper side of said third diffusion layer are covered with said etching protective layer.

4. A method of producing a solid imaging device, comprising performing an isolation oxide film forming step of forming an isolation oxide film in a principal surface of a semiconductor substrate;

performing a gate electrode forming step of forming a gate electrode at a position selected from an upper surface of said isolation oxide film;

performing a first implantation step of implanting an impurity at a first concentration into a first region and a second region which are in said principal surface and defined by said isolation oxide film and which are in an opposite positional relationship with respect to each other to sandwich said gate electrode, thereafter performing an oxide film covering step of covering an entire surface of said semiconductor substrate with an oxide film;

thereafter performing a nitride film covering step of forming a nitride film to cover the entire surface of said semiconductor substrate;

performing a side wall spacer forming step of partially removing the nitride film so as to form a side wall spacer that covers a side part of the gate electrode from the nitride and to leave the oxide film; and performing a second implantation step of implanting an impurity at a second concentration into said principal surface of only said first region.

5. The method of producing a solid imaging device according to claim 4, wherein said second implantation step includes masking said second region to prevent said second concentration impurity from being implanted into said principal surface of said second region.

6. A method of producing a solid imaging device, comprising:

performing an isolation oxide film forming step of forming an isolation oxide film in a principal surface of a semiconductor substrate;

performing a gate electrode forming step of forming a gate electrode at a position selected from an upper surface of said isolation oxide film;

performing a side wall spacer forming step of forming a side wall spacer to cover a side part of said gate electrode;

performing a first implantation step of implanting a first impurity under a first condition into an active region which is in said principal surface and defined by said isolation oxide film and which is adjacent to said gate electrode; and performing a second implantation step of implanting a second impurity into said active region under a second condition such that the second impurity is diffused in a range that includes and goes beyond a part to which the first impurity implanted in said first implantation step is diffused, as viewed from above.

7. The method of producing a solid imaging device according to claim 6, wherein said gate electrode and said side wall spacer are formed to be limited within an area of said isolation oxide film, as viewed from above, in said gate electrode forming step and in said side wall spacer forming step, and wherein said isolation oxide film electrically isolate, as viewed from above, elements on the semiconductor substrate from each other.

* * * * *